April 9, 1963 W. W. WRIGHT 3,085,139

PRINTED CIRCUIT MOUNTING MEANS FOR SWITCH BLADES

Filed May 19, 1960

INVENTOR:
William Warren Wright,
BY Bair, Freeman & Molinare
ATTORNEYS.

3,085,139
Patented Apr. 9, 1963

3,085,139

PRINTED CIRCUIT MOUNTING MEANS FOR SWITCH BLADES

William Warren Wright, Wheaton, Ill., assignor to Guardian Electric Manufacturing Company, a corporation of Illinois Filed May 19, 1960, Ser. No. 30,189
1 Claim. (Cl. 200—166)

This application relates generally to printed circuit constructions and more particularly to a new and improved method and means for mounting electro-mechanical elements, such as switch blades, and terminal members, on printed circuit boards.

In the manufacture of printed circuit apparatus, it often is desirable to connect electro-mechanical elements to the printed circuitry, but in many cases this practice presents serious problems. For example, there are many applications where it would be advantageous to mount and attach leaf-type switch blades to a printed circuit board so that solder dip electrical connections can be made between the switch blades and the printed circuit on the board. Various techniques have been adopted in the past to effect such an attachment, including the use of eyelets, rivets, studs, spring clip attachments and the like, but these prior art techniques have not proved entirely satisfactory for this purpose.

Those skilled in the art will readily appreciate that the problems presented in the use of such prior art techniques have resulted from the many difficulties inherent in the construction and use of printed circuit board switch blades. Thus the mounting and/or attachment of the switch blades to the printed circuit board must be made in such a manner that the final assembly is capable of withstanding numerous switching operations without fatigue or breaking of the switch blades, without fatigue or breaking of the soldered connections of the switch blades to the printed circuit, and without destroying the bond between the printed circuit and the printed circuit board.

Accordingly, it is a general object of this invention to provide new and improved means and technique for attaching or mounting electro-mechanical elements to a printed circuit board.

It is a more specific object of this invention to provide a new and improved printed circuit board and switch blade assembly.

In accordance with one of its specific features, the invention comprises mechanical locking means for maintaining the switch blades rigidly mounted on the printed circuit board even before the switch blades are soldered to the printed circuitry. Thus it is a feature that the preliminary attachment of a switch blade to the board before soldering presents resistance to motion transfer through the blade to the connection area of the printed circuit.

To this end, each switch blade is formed with a recessed portion shaped to receive a locking tab adapted to be positioned between a pair of similarly shaped blades. Thus each pair of switch blades are inserted through a suitable aperture in the printed circuit board and the recessed portion in each blade serves to properly locate the blades with respect to each other—so that their contact points will be aligned and with respect to the board so that the portions to be soldered to the printed circuit extend a desired distance from the board.

A shaped locked tab then is inserted into the tab receiving recesses of each blade and the dimensions of the tab are related to the dimensions of the opening in the board to rigidly secure and mechanically lock the blades to the board. As the blades now are positively locked in proper position on the board, solder dipping of the final assembly for long term positive connection is greatly facilitated.

Accordingly it is a further object of this invention to provide a novel method and means for positive locking of the mounted parts of switch blades in a printed circuit.

It is a still further object of this invention to provide a relatively simple, fast and low cost assembly procedure for positioning switch blades in proper relation to each other on a printed circuit board, and in proper relation to actuating devices and to the printed circuit.

It is another object of this invention to provide a novel method and means for mounting switch blades on a printed circuit board which facilitates solder dipping of the final assembly and which compensates for variations in the thickness of the printed circuit and locking tab.

In accordance with another specific feature of the invention, an effective mechanical and electrical connection is provided between the switch blades and the printed circuit even before the soldering thereof. To this end, each switch blade is provided with an upstanding retaining finger that is placed in contacting relationship with the printed circuit when the switch blade is mounted and aligned on the printed circuit board. Such electrical connection is facilitated by the pressure or tension provided by the interaction of locking tab and the blade recessed portions which causes the finger to be pressed firmly against the printed circuit. Thus, the electrical connection between the blade and printed circuit is made mechanically secure before soldering in acocrdance with the requirements of established standards for electrical terminal apparatus.

Thus, it is still another object of this invention to provide an effective mechanical and electrical connection of an element to a printed circuit before soldering.

Those skilled in the art will appreciate from the present application that the invention is applicable to electro-mechanical elements other than switch blades, the latter having been disclosed in detail as only one illustrative embodiment of the invention. Thus, it is contemplated that tab or taper type terminals may be attached to a printed circuit board support by utilizing the principles of the invention. Such attachment provides an inherent mechanical stability so that the insertion and removal of a mating electrical connector places little or no strain on the soldered electrical connection.

Further, the methods and means of attachment to the printed circuit board comprising the present invention facilitates the removal or replacement of the switch blades or terminals in a comparatively simple manner. This may be effected merely by removing the locking tab, heating the solder and pressing the blade or terminal inward toward the aperture in the printed circuit board. Thus, simple field repair of a circuit is permitted without the need for complicated tools.

It is still another object of this invention to provide such a novel method and means, as above, which enables a greatly improved mechanical and electrical connection of an electro-mechanical element, such as a switch blade or terminal member to a printed circuit.

The above and other novel objects and features which are characteristic of the invention are set forth with particularity in the appended claims. The invention itself, however, both as to its organization and method of operation, together with further objects and advantages thereof will best be understood by reference to the following description taken in conjunction with the accompanying drawings in which:

Figure 1:
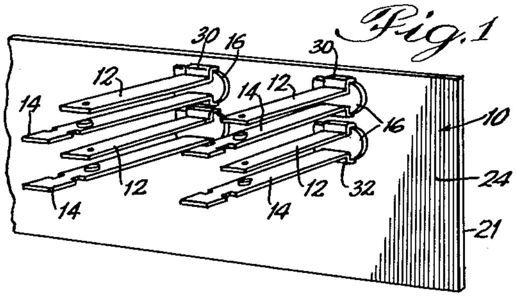
FIGURE 1 is a perspective view of an illustrative printed circuit board and switch blade assembly embodying the invention.
Figure 2:
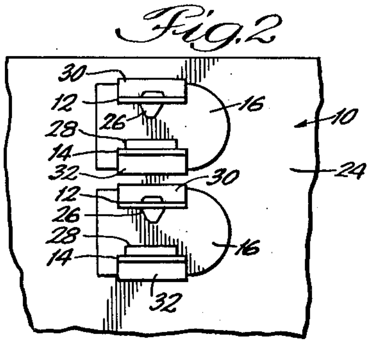
FIGURE 2 is a front elevational view and FIGURE 3 is a rear elevational view, partly in cross section, of a portion of the invention embodiment illustrated in FIGURE 1.

Referring now to the drawing, and more particularly to FIGURE 1 thereof, there is illustrated a preferred embodiment of the invention wherein a plurality of switch blades are arranged in operative pairs and are securely mounted upon a printed circuit board 10. In accordance with a feature of this invention, each pair of switch blades as, for example the pair of switch blades 12 and 14, is adapted to be electrically connected to a printed circuit 20 provided on at least one surface of the printed circuit board 10 and is further adapted to be mechanically locked to the printed circuit board 10 as by means of a unique locking tab 16 which cooperates with shaped tab receiving recesses formed in the switch blades, as explained in greater detail hereinbelow.

The printed circuit board 10 may take any one of a number of forms well known in the art for such apparatus, and in the illustrative example depicted in the drawing, the printed circuit board 10 takes the form of a generally flat member having a pair of planar surfaces 21 and 24 at opposing sides thereof.

Figures 3, 4, 5, 6:
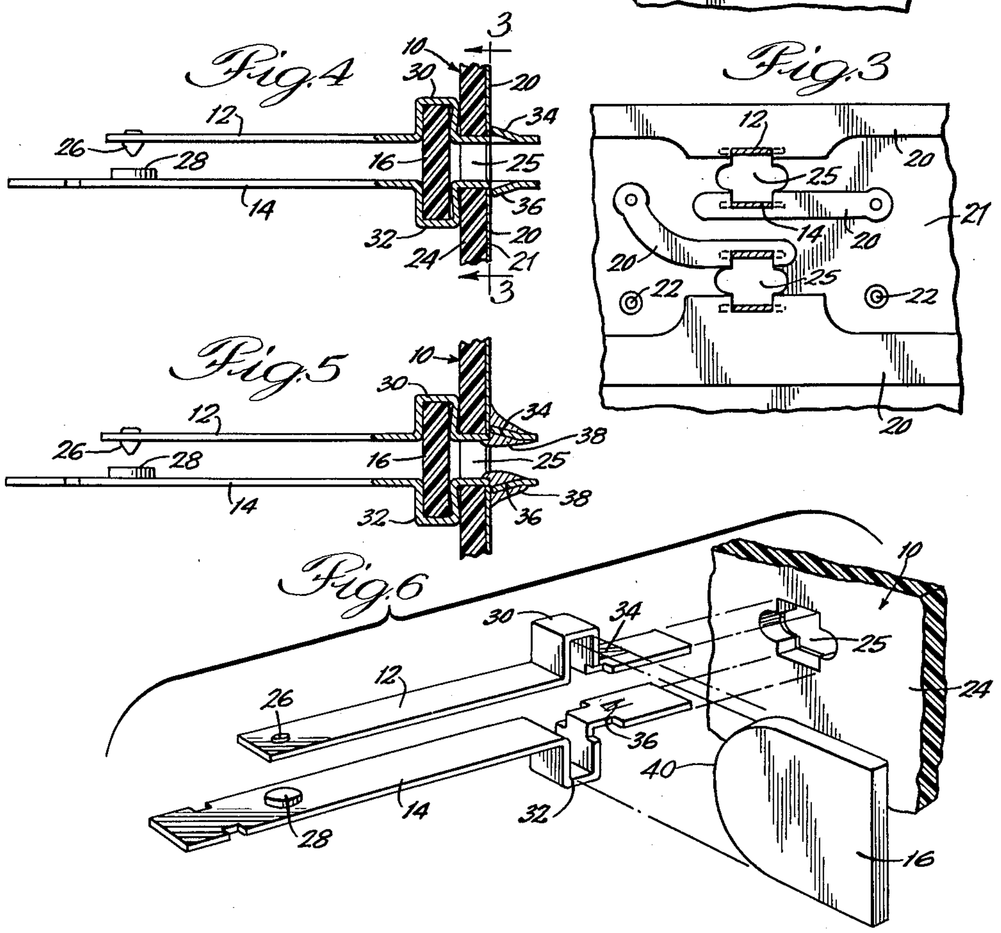
FIGURES 4 and 5 are side elevational views, partly in cross section, of an illustrative switch blade and printed circuit board assembly in accordance with the invention, before and after solder dipping, respectively.
FIGURE 6 is an exploded view of one embodiment of the invention, illustrating the manner in which the component parts are assembled.

A printed circuit, such as the printed circuit 20 shown particularly in FIGURE 3, is provided on at least one of the planar surfaces of the printed circuit board. As well understood by those skilled in the art, the printed circuit 20 may take on any desired configuration and may be bonded to a planar surface 21 of the printed circuit board 10 in any suitable manner.

The printed circuit board 10 is formed with a plurality of apertures 25 extending therethrough, said apertures being adapted to receive the terminals of a plurality of switch blades which are mounted upon the printed circuit board 10 for electrical connection to the printed circuit 20.

In addition, the printed circuit board may be formed with a further plurality of apertures 22 for receiving the terminals of electrical components such as resistors, condensers, and the like.

Prior known techniques for mounting the switch blades to the printed circuit board have not proved entirely satisfactory. Previously, the methods of attaching or mounting switch blades to the printed circuit board made use of various fastening devices, such as eyelets, rivets, studs, spring-clip attachments, and the like, but those skilled in the art are familiar with the problems created in the use of such fastening devices.

In accordance with a feature of this invention, these prior art difficulties are obviated by the combination of uniquely shaped switch blades and mechanical locking tabs associated therewith. As clearly seen in FIGURES 1, 4, 5, and 6 of the drawing, each switch blade is formed with a generally U-shaped tab receiving recess which provides several highly advantageous features in the assembly of the switch blades upon the printed circuit board. Thus, the switch blade 12 is formed with the U-shaped tab receiving recess 30 and the switch blade 14 is formed with the U-shaped tab receiving recess 32. These operatively associated switch blades are positioned on the printed circuit board 10 by inserting one end terminal of each switch blade through the opening 25 in the printed circuit board. Advantageously, the switch blades 12 and 14 are inserted through the opening 25 such that their respective tab receiving recesses extend in opposite directions so as to enable the locking tab 16 to be inserted therebetween.

As particularly shown in FIGURES 4 and 5 of the drawing, the tab receiving recesses 30 and 32 serve to properly align and position their respective switch blades when the switch blades are inserted in an aperture 25 of the printed circuit board 10. Thus, a portion of each tab receiving recess abuts one planar surface of the printed circuit board to properly position the switch blades with respect to each other, with respect to their associated actuating devices, and with respect to the printed circuit.

Advantageously, this positioning of the switch blades on the printed circuit board is facilitated by the provision of a retaining finger on each switch blade. This is exemplified by the retaining finger 34 at one end terminal of switch blade 12 and the retaining finger 36 at one end terminal of the switch blade 14. Advantageously, each retaining finger may be formed from the body of its switch blade as by making a U-shaped cut in the end terminal portion of the switch blade, adjacent the tab receiving recess, and by extending the retaining finger thus formed outwardly from the switch blade in the direction of the tab receiving recess.

It can now be seen, as particularly illustrated in FIGURE 4 of the drawing, that the tab reeciving recess and the retaining finger of each switch blade serves to properly position each switch blade on the printed circuit board 10.

Those skilled in the art will readily appreciate that the preliminary attachment of the switch blade to the printed circuit board before soldering must present adequate resistance to motion transfer through the switch blade to the connection area of the blade to the printed circuit. In accordance with a feature of this invention, the switch blades are rigidly and securely mounted to the board in their unsoldered state by means of a locking tab 16 adapted to be inserted between the tab receiving recesses of an associated pair of switch blades. The locking tab 16, which may be tapered or rounded at one end thereof, as exemplified by the rounded edge 40 in FIGURE 6, is adapted to be force-fitted between the tab receiving recesses 30 and 32 provided in the switch blades 12 and 14, respectively.

Advantageously, the thickness of the locking tab 16, is selected so that the tab fits snugly within the tab receiving recesses 30 and 32. As clearly illustrated in FIGURE 4 of the drawings, the locking tab 16 serves to position the tab receiving recesses 30 and 32 in abutting relationship with the planar surface 24 of the printed circuit board 10, so as to positively lock the switch blades in proper position on the printed circuit board.

It can be seen from FIGURES 4 and 5 of the drawing that the locking action of the tab 16 properly positions the blade contacts 26 and 28 with respect to each other so that a desired electrical circuit is completed when the switch blades are operated by their associated actuating device. In addition, the locking action of the tab 16 serves to place the retaining fingers 34 and 36 of the switch blades 12 and 14, respectively, in adjacent relationship to the printed circuit 20, to facilitate the electrical connection between the switch blades and the printed circuit.

Thus, it can be seen that after the switch blades are properly assembled and mounted on the printed circuit board 10, the entire assembly may be solder-dipped to provide the desired electrical connections between the printed circuit 20 and the switch blades. This is particularly illustrated in FIGURE 5 of the drawing, wherein the solder portion 38 can be seen as making an electrical connection between the end terminal of each switch blade and the printed circuit 20.

It will now be appreciated by those skilled in the art that the invention provides mechanical and electrical connection of a switch blade to a printed circuit board wherein a final assembly is able to withstand many operations without fatigue or breaking of the switch blades, without breaking of the soldered connections between the switch blades and the printed circuits, and without destroying the bond between the printed circuit and the printed circuit board. These advantages are derived from the fact that substantially all motion of the switch blades occurs at switch blade positions remote from the electrical connections of the printed circuit to the switch blade contacts. The locking tab 16 prevents any motion transfer of the switch blades to the surface 21 of the printed circuit board 10 where the electrical connection between the switch blade and the printed circuit is made. Manifestly, this unique assembly serves to prevent any cracking or breaking of the soldered connection between the blade and the printed circuit.

In addition, it has been shown that a standard rosin flux advantageously may be utilized in soldering the switch blade or terminal to the printed circuit. With this arrangement, the rosin in the flux serves to glue the locking tab firmly in place so that the end assembly is extremely stable. The subsequent unlocking of the tabs for removal necessitates the removal or breaking of the bond created by the rosin flux.

In addition to the above-stated advantages, the invention permits a simple, fast and low cost assembly procedure. Also, the invention permits a similarly simple, fast and low cost disassembly procedure when it is desired to remove or replace the switch blades or terminals. As stated heretofore, this operation is effected merely by removing the locking tab, heating the solder and pressing the blade or terminal toward the board aperture for removal therefrom.

Further, the invention provides a reduction in the overall cost of the assembly as used in production. Those skilled in the art will readily appreciate that the switch blades or terminals can be formed with tab receiving recesses at low cost, and that the locking tabs can be formed at low cost. Further, the tab itself compensates for normal manufacturing tolerances. Thus, compensation is provided for variations in thickness of the printed circuit, the printed circuit board, or the locking tab, while at the same time, positive locking of the switch blades or terminals to the printed circuit board also is provided.

While there has been shown and described a specific illustrative embodiment of the invention, it will, of course, be understood that various modifications and alternative constructions may be made without departing from the true spirit and scope of the invention. Therefore, it is intended to cover by the appended claim all such modifications and alternative constructions as fall within their true spirit and scope.

What is claimed as the invention is:

The improvement of printed circuit apparatus comprising the combination of a printed circuit board having a pair of planar surfaces and a printed circuit bonded to at least one of said surfaces, a pair of elongated resilient blades operatively mounted on said printed circuit board, said printed circuit board being formed with an aperture shaped to receive said pair of blades, each of said blades having a tab receiving recess portion and a retaining finger portion spaced from each other a distance approximately equal to the thickness of said printed circuit board, said portions being positioned in abutting relation to opposite planar surfaces of said printed circuit board to align said blade on said board whereby a terminal of each blade extends through said aperture and adjacent said printed circuit for electrical connection thereto, the retaining finger portion on each blade serving to facilitate soldering of the blade to the printed circuit to effect an electrical connection therebetween and further to facilitate the secure fastening of the blade to the printed circuit board, and locking tab means adapted to be inserted between said pair of blades in the tab receiving recess portion of each blade for mechanically locking said pair of blades to said printed circuit board, said locking tab means being formed with one end of gradually reducing width to facilitate insertion of the locking tab means in said tab receiving recess portions.

References Cited in the file of this patent

UNITED STATES PATENTS

| | | |
|---|---|---|
| 2,790,961 | Del Camp | Apr. 30, 1957 |
| 2,922,138 | Comins | Jan. 19, 1960 |

FOREIGN PATENTS

| | | |
|---|---|---|
| 924,279 | Germany | Feb. 28, 1955 |